US012667009B2

(12) United States Patent (10) Patent No.: US 12,667,009 B2
Costa et al. (45) Date of Patent: Jun. 23, 2026

(54) STACKED DIE PACKAGE AND METHODS OF FORMING THE SAME

(71) Applicant: Qorvo US, Inc., Greensboro, NC (US)

(72) Inventors: Julio C. Costa, Oak Ridge, NC (US); Robert L. Sowell, III, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 742 days.

(21) Appl. No.: 17/989,396

(22) Filed: Nov. 17, 2022

(65) Prior Publication Data

US 2023/0163103 A1 May 25, 2023

Related U.S. Application Data

(60) Provisional application No. 63/281,352, filed on Nov. 19, 2021.

(51) Int. Cl.
*H01L 25/065* (2023.01)
*B81B 7/00* (2006.01)
(Continued)

(52) U.S. Cl.
CPC ........... *H10W 90/00* (2026.01); *B81B 7/0074* (2013.01); *B81C 1/00301* (2013.01); *H10W 70/05* (2026.01); *H10W 70/093* (2026.01); *H10W 70/65* (2026.01); *H10W 70/685* (2026.01); *H10W 74/016* (2026.01); *H10W 90/701* (2026.01); *B81B 2207/012* (2013.01); *B81B 2207/07* (2013.01); *B81B 2207/092* (2013.01); *B81B 2207/094* (2013.01); *B81B 2207/097* (2013.01); *B81C 2203/032* (2013.01); *B81C 2203/035* (2013.01); *B81C 2203/0771* (2013.01); *H10W 72/01* (2026.01);

*H10W 72/07253* (2026.01); *H10W 72/234* (2026.01); *H10W 72/252* (2026.01); *H10W 72/823* (2026.01); *H10W 72/856* (2026.01); *H10W 72/877* (2026.01); *H10W 74/00* (2026.01);

(Continued)

(58) Field of Classification Search
None
See application file for complete search history.

(56) References Cited

U.S. PATENT DOCUMENTS

| | | | |
|---|---|---|---|
| 10,964,554 B2 * | 3/2021 | Hammond | ............ H10W 70/09 |
| 2018/0044169 A1 * | 2/2018 | Hatcher, Jr. | ............. B81B 7/007 |
| 2025/0349724 A1 * | 11/2025 | Chen | ....................... H10P 72/74 |

* cited by examiner

*Primary Examiner* — Long Pham
(74) *Attorney, Agent, or Firm* — Withrow & Terranova, P.L.L.C.

(57) ABSTRACT

The present disclosure describes a process for making a three-dimensional (3D) package, which starts with providing a mold precursor module that includes a first device die and a floor connectivity die (FCD) encapsulated by a mold compound. The FCD includes a sacrificial die body and multiple floor interconnections underneath the sacrificial die body. Next, the mold compound is thinned down until the sacrificial die body of the FCD is completely consumed, such that each floor interconnection is exposed through the mold compound. The thinning down step does not affect a device layer in the first device die. A second device die, which includes a die body and multiple electrical die interconnections, is then mounted over the exposed floor interconnections. Herein, each electrical die interconnection is vertically aligned with and electrically connected to a corresponding floor interconnection from the FCD.

20 Claims, 13 Drawing Sheets

Figure 1:
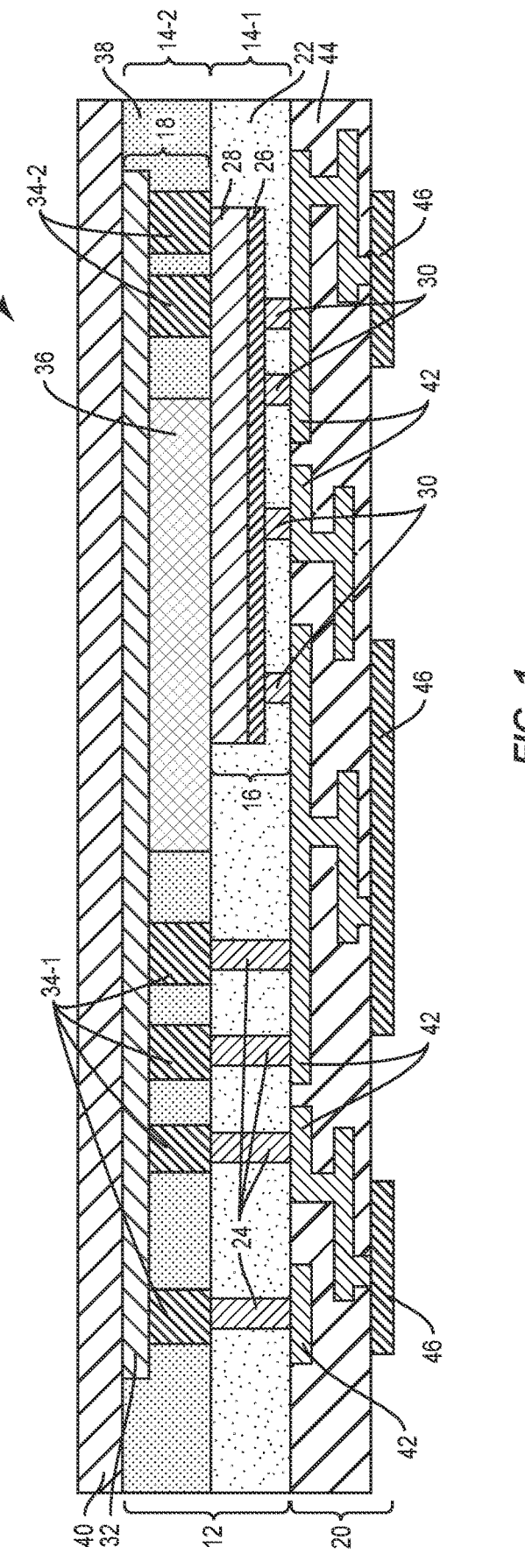

(51) Int. Cl.

| | |
|---|---|
| *B81C 1/00* | (2006.01) |
| *H10W 70/05* | (2026.01) |
| *H10W 70/65* | (2026.01) |
| *H10W 70/685* | (2026.01) |
| *H10W 74/01* | (2026.01) |
| *H10W 90/00* | (2026.01) |
| *H10W 72/00* | (2026.01) |
| *H10W 72/20* | (2026.01) |
| *H10W 74/00* | (2026.01) |
| *H10W 74/10* | (2026.01) |
| *H10W 74/40* | (2026.01) |
| *H10W 90/20* | (2026.01) |
| *H10W 90/24* | (2026.01) |

(52) U.S. Cl.

CPC ............ *H10W 74/10* (2026.01); *H10W 74/40* (2026.01); *H10W 90/20* (2026.01); *H10W 90/24* (2026.01); *H10W 90/722* (2026.01); *H10W 90/724* (2026.01); *H10W 90/732* (2026.01)

STACKED DIE PACKAGE AND METHODS OF FORMING THE SAME

RELATED APPLICATIONS

This application claims the benefit of provisional patent application Ser. No. 63/281,352, filed Nov. 19, 2021, the disclosure of which is hereby incorporated herein by reference in its entirety.

FIELD OF THE DISCLOSURE

The present disclosure relates to a three-dimensional (3D) package and a process for making the same, and more particular to a 3D package with vertically stacked dies on a multilayer laminate, and a packaging process to provide the 3D package with at least two dies that are vertically stacked.

BACKGROUND

With the popularity of portable consumer electronic products, such as smart phones, tablet computers, and so forth, stacked-die assemblies are becoming more and more attractive in microelectronics packages to achieve electronics densification in a small footprint.

However, the thickness of each stacked semiconductor die may result in a large thickness of the microelectronics package, which may not meet low-profile requirements for modern portable products. In most semiconductor dies, all signal processing is performed in a very thin portion of the die. The rest of the majority of the semiconductor die (height up to 150 um or more) is the semiconductor substrate, which is useless for the signal processing. The thick semiconductor substrate has use only during the die handling and assembly to provide mechanical stability. In addition, the conventional stacked-die assemblies typically involve photolithography/etching/plating steps, which may significantly increase the packaging cost.

Accordingly, to accommodate the low-profile requirements for portable products, and reduce the cost of the packaging process, it is therefore an object of the present disclosure to provide an improved packaging design to allow for stacking of dies in a reduced package size without expensive and complicated processes.

SUMMARY

The present disclosure describes a three-dimensional (3D) package with vertically stacked dies and a process for making the same. The disclosed 3D package includes a multilayer laminate with connecting layers and a mold device region over the multilayer laminate. The mold device region is composed of a first device floor over the multilayer laminate and a second device floor over the first device floor. Herein, the first device floor includes a first mold compound, a number of floor interconnections, and a first device die. The first device die is attached to a top surface of the multilayer laminate, the first mold compound resides over the top surface of the multilayer laminate and surrounds the first device die, and each floor interconnection extends through the first mold compound. The second device floor includes a second mold compound and a second device die. The second device die is attached to a top surface of the first device floor, and the second mold compound resides over the top surface of the first device floor and surrounds the second device die. Certain ones of the floor interconnections are configured to electrically connect the second device die to the first device die via corresponding connecting layers in the multilayer laminate.

According to an exemplary process, a first mold precursor module, which includes a multilayer laminate, an intact first device die, a floor connectivity die, and a first mold compound, is firstly provided. Herein, the intact first device die includes a device layer, a silicon substrate over the device layer, and a number of first die interconnections extending from a bottom surface of the device layer towards a top surface of the multilayer laminate. The floor connectivity die includes a sacrificial die body and a number of floor interconnections extending from a bottom surface of the sacrificial die body towards the top surface of the multilayer laminate. The first mold compound resides over the top surface of the multilayer laminate so as to encapsulate the intact first device die and the floor connectivity die. Each floor interconnection has a same height greater than a height of a combination of the device layer and the first die interconnections of the intact first device die. Next, the first mold compound is thinned down until the sacrificial die body of the floor connectivity die is completely consumed, such that each floor interconnection is exposed through the first mold compound. An intact second device die is then mounted over the floor interconnections. The intact second device die includes an intact die body and a number of electrical second die interconnections extending from a bottom surface of the intact die body. A layout arrangement of the electrical second die interconnections matches a layout arrangement of the floor interconnections, and each electrical second die interconnection is vertically aligned with and electrically connected to a corresponding floor interconnection.

In one embodiment of the exemplary process, the intact second device die further includes at least one dummy second die interconnection extending from the bottom surface of the intact die body. The at least one dummy second die interconnection is configured to provide mechanical support to the intact die body of the intact second device die and is not connected to any of the floor interconnections exposed through the first mold compound.

In one embodiment of the exemplary process, the at least one dummy second die interconnection is a copper pillar or a solder bump.

In one embodiment of the exemplary process, the intact second device die further includes an adhesive layer underneath the bottom surface of the intact die body. The adhesive layer is configured to provide stability to the intact die body of the intact second device die and is not connected to any of the floor interconnections exposed through the first mold compound.

In one embodiment of the exemplary process, the intact first device die is a micro-electro-mechanical system (MEMS) die, and the intact second device die is a controller die that controls the intact first device die.

In one embodiment of the exemplary process, an entire height of the intact first device die is greater than the height of each floor interconnection, such that a portion of the silicon substrate is consumed in the thinning down process of the first mold compound. The silicon substrate is converted to a short silicon substrate, and the intact first device die is converted to a short first device die. The first mold compound surrounds the short first device die and does not cover a top surface of the short silicon substrate.

According to one embodiment, the exemplary process further includes an elimination step after thinning down the first mold compound. During the elimination step, the short silicon substrate is eliminated from the short first device die to provide a thinned first device die and form a first opening within the first mold compound and over the thinned first device die. A second mold compound is then applied to fill the first opening. Before mounting the intact second device die, the second mold compound is planarized to form a first device die and complete a first device floor. Herein, the first device die includes the thinned first device die and the second mold compound. A top surface of the second mold compound of the first device die, a top surface of the first mold compound, and a top surface of each floor interconnection are co-planar and compose a top surface of the first device floor. The intact second device die is mounted on the top surface of the first device floor.

In one embodiment of the exemplary process, the first mold compound and the second mold compound are formed of different materials.

According to one embodiment, the exemplary process further includes, after mounting the intact second device die, applying a third mold compound over the top surface of the first device floor to encapsulate the intact second device die.

According to one embodiment, the exemplary process further includes thinning down the third mold compound to complete a second device floor over the first device floor. Herein, the third mold compound is thinned down until a portion of the intact die body of the intact second device die is consumed. The intact die body is converted to a die body, and the intact second device die is converted to a second device die. The third mold compound surrounds the second device die and does not cover a top surface of the die body. A top surface of the third mold compound and a top surface of the top surface of the die body are co-planar and compose a top surface of the second device floor.

According to one embodiment, the exemplary process further includes applying a lamination sheet over the top surface of the second device floor.

In one embodiment of the exemplary process, the second device die has a larger lateral size than the first device die, and the first device die at least partially overlaps with the second device die.

In one embodiment of the exemplary process, the first mold compound and the second mold compound are formed of different materials, and the first mold compound and the third mold compound are formed of a same material.

In one embodiment of the exemplary process, each electrical second die interconnection is a copper pillar or a solder bump, each first die interconnection is a copper pillar or a solder bump, and each floor interconnection is a copper pillar.

In one embodiment of the exemplary process, each floor interconnection has a height between 50 µm and 100 µm.

In one embodiment of the exemplary process, the multilayer laminate includes multiple connecting layers and a dielectric pattern which separates the connecting layers from each other. Certain connecting layers are configured to electrically connect the intact first device die and the intact second device die via corresponding ones of the floor interconnections.

In one embodiment of the exemplary process, an entire height of the intact first device die is less than the height of each floor interconnection, such that no portion of the silicon substrate is consumed in the thinning down process of the first mold compound, and the intact first device die remains fully encapsulated by the first mold compound.

In one embodiment of the exemplary process, a top surface of the short silicon substrate of the short first device die, a top surface of the first mold compound, and a top surface of each of the plurality of floor interconnections are co-planar. The intact second device die is mounted over the short first device die.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates an exemplary 3D package with vertically stacked dies according to one embodiment of the present disclosure.

FIGS. 2-12 provide exemplary steps that illustrate a process to fabricate the exemplary 3D package shown in FIG. 1.

It will be understood that for clear illustrations, FIGS. 1-12 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 shows an exemplary three-dimensional (3D) package 10 with vertically stacked dies according to one embodiment of the present disclosure. For the purpose of this illustration, the exemplary 3D package 10 includes a mold device region 12 that is composed of a first device floor 14-1 with a first device die 16 and a second device floor 14-2 with a second device die 18, and a multilayer laminate 20 formed underneath the mold device region 12. Herein, the first device floor 14-1 resides over the multilayer laminate 20, and the second device floor 14-2 resides over the first device floor 14-1. In different applications, each device floor 14-1/14-2 may have more than one device die and may have other surface mount devices.

In detail, besides the first device die 16, the first device floor 14-1 further includes a first mold compound 22 and multiple floor interconnections 24. The first device die 16 is attached to a top surface of the multilayer laminate 20. The first mold compound 22 resides over the top surface of the multilayer laminate 20 to surround and underfill the first device die 16. The first mold compound 22 may be formed of a standard molding material, such as an organic epoxy resin system. Each floor interconnection 24 may be a copper pillar and extends vertically through the first mold compound 22. In this illustration, the floor interconnections 24 are located at one side of the first device die 16. For different applications, the floor interconnections 24 may surround the first device die 16 (not shown).

The first device die 16 includes a device layer 26, a second mold compound 28 over the device layer 26, and first die interconnections 30 extending from a bottom surface of the device layer 26 towards the top surface of the multilayer laminate 20. As such, the first mold compound 22 fills gaps among the first die interconnections 30 and encapsulates side surfaces of the device layer 26 and side surfaces of the second mold compound 28.

The device layer 26 with a thickness between 10 nm and 20000 nm may be formed of one or more of silicon oxide, gallium arsenide, gallium nitride, silicon germanium, silicon nitride, aluminum nitride and the like. The device layer 26 is configured to provide active and/or passive functionalities. Due to different functionalities provided by the device layer 26, the second mold compound 28 may be formed of a same material as the first mold compounds 22, formed of a high electric permittivity molding material (e.g., the electric permittivity>10, such as a molding material containing alumina and/or barium titanate), a high thermal conductivity molding material (e.g., the thermal conductivity>1 W/mK, such as a molding material having graphene added or a molding material having graphene alumina filler added), or a high magnetic permeability material (e.g., the magnetic permeability>50, such as a molding material with added powder containing iron, nickel, cobalt or a molding material with added powder containing ferri/ferro-magnetic materials, like magnetite, Ytrium-Iron-G, etc.). The standard molding material with silica fillers has a low thermal conductivity around 1 W/mK. Using added graphene to alumina compounds, the thermal conductivity can be increased above 5 W/mK or even above 10 W/mK. The thickness of the second mold compound 28 is between a few micrometers and several tens of micrometers. In some applications, the first device die 16 includes a silicon substrate instead of a second mold compound 28 over the device layer 26 (not shown). Each first die interconnection 30 with a height between 5 μm and 60 μm may be a copper pillar or a solder ball bump. Regardless that the first device die 16 includes the second mold compound 28 or the silicon substrate, a backside of the first device die 16 is always non-conductive.

Notice that the first device die 16, the first mold compound 22, and each floor interconnection 24 have substantially the same height (e.g., between 50 μm and 100 μm). A top surface of the second mold compound 28 (or a top surface of the silicon substrate) of the first device die 16, a bottom surface of each first die interconnection 30 of the first device die 16, a top surface and a bottom surface of each floor interconnection 24 are not covered by the first mold compound 22. In one embodiment, the top surface of the second mold compound 28 (or the top surface of the silicon substrate) of the first device die 16, a top surface of the first mold compound 22, and the top surface of each floor interconnection 24 are co-planar and compose a top surface of the first device floor 14-1.

The second device die 18, within the second device floor 14-2 and over the first device floor 14-1, includes a die body 32 and multiple second die interconnections 34 extending from a bottom surface of the die body 32 towards the top surface of the top surface of the first device floor 14-1. The die body 32 is configured to provide active and/or passive functionalities of the second device die 18, and may be formed of one or more of silicon, silicon oxide, gallium arsenide, gallium nitride, silicon germanium, silicon nitride, aluminum nitride and the like. In one embodiment, the first device die 16 may be a micro-electro-mechanical system (MEMS) die, while the second device die 18 may be a controller die that controls the MEMs die 16. Alternatively, the first device die 16, the second device die 18 may be a silicon-on-insulator (SOI) die, an integrated passive die (IPD), a low-noise amplifier (LNA) Complementary metal-oxide-semiconductor (CMOS) die, or the like. Typically, the second device die 18 has a larger lateral size than the first device die 16. The first device die 16 may partially or completely overlap with the second device die 18.

Each second die interconnection 34 with a height between 5 μm and 60 μm may be a copper pillar or a solder ball bump. The second die interconnections 34 include multiple electrical second die interconnections 34-1 and one or more optional dummy second die interconnections 34-2. Each electrical second die interconnection 34-1 is vertically aligned with a corresponding floor interconnection 24 and electrically connects an input/output port (I/O) of the die body 32 (not shown) to the corresponding floor interconnection 24. The electrical second die interconnections 34-1 may be connected to the floor interconnections 24 via a solder material or a conductive adhesive material (not shown). In this illustration, the electrical second die interconnections 34-1 are located at one side of the second device die 18 (corresponding to the current layout arrangement of the floor interconnections 24). For different applications, the electrical second die interconnections 34-1 may surround the second device die 18 (corresponding to different layout arrangements of the floor interconnections 24).

The dummy second die interconnections 34-2 (if exist) are not configured to provide electrical connections (i.e., are not connected to any floor interconnection 24), but are configured to provide mechanical support/stability to the die body 32. The dummy second die interconnections 34-2 (if exist) may be coupled to the backside of the first device die 16 and/or top surface of the first mold compound 22 via a solder material or an adhesive material (not shown). In addition, the second device die 18 may further include an adhesive layer 36, which is configured to provide adhesion between the die body 32 and the first device floor 14-1 and to provide further stability to the die body 32. The adhesive layer 36 may be coupled to the backside of the first device die 16 and/or top surface of the first mold compound 22. The adhesive layer 36 and/or the dummy second die interconnections 34-2 may be omitted in the second device die 18 if the electrical second die interconnections 34-1 provide enough stability to the die body 32 (e.g., the electrical second die interconnections 34-1 surround the second device die 18).

For the second device floor 14-2, besides the second device die 18, there further includes a third mold compound 38, which resides over the top surface of the first device floor 14-1 to surround and underfill the second device die 18. In particular, the third mold compound 38 fills gaps among the second die interconnections 34 and the adhesive layer 36 and encapsulates side surfaces of the die body 32. The third mold compound 38 may be formed of a same material as the first mold compound 22.

In one embodiment, the 3D package 10 may further include a lamination sheet 40, which is configured for package labeling, over a top surface of the second device floor 14-2. Herein, the second device die 18 and the third mold compound 38 have substantially the same height (e.g., between 50 μm and 200 μm). As such, a top surface of the die body 32 of the second device die 18, a bottom surface of each second die interconnection 34 of the second device die 18, a bottom surface of the adhesive layer 36 (if exists) are not covered by the third mold compound 38. In one embodiment, the top surface of the die body 32 of the second device die 18 and a top surface of the third mold compound 38 are co-planar and compose the top surface of the second device floor 14-2.

The multilayer laminate 20 includes a number of connecting layers 42, a dielectric pattern 44, and a number of package pads 46. Herein, some of the connecting layers 42 are configured to electrically connect the first device die 16 and the second device die 18 via one or more floor interconnections 24, some of the connecting layers 42 are configured to electrically connect the second device die 18 and corresponding package pads 46 via one or more floor interconnections 24, and/or some of the connecting layers 42 are configured to electrically connect the first device die 16 and corresponding package pads 46. The dielectric pattern 44 is formed around and underneath each connecting layer 42 to isolate the connecting layers 42 from each other. The package pads 46 are separate from each other, located at a bottom portion of the multilayer laminate 20, and protrude from the dielectric pattern 44. In different applications, the multilayer laminate 20 may be replaced by a Low Temperature Co-Fired Ceramic (LTCC) or a printed circuit board (PCB).

FIGS. 2-12 provide an exemplary fabricating and packaging process that illustrates steps to provide the 3D package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-12.

Figure 2:
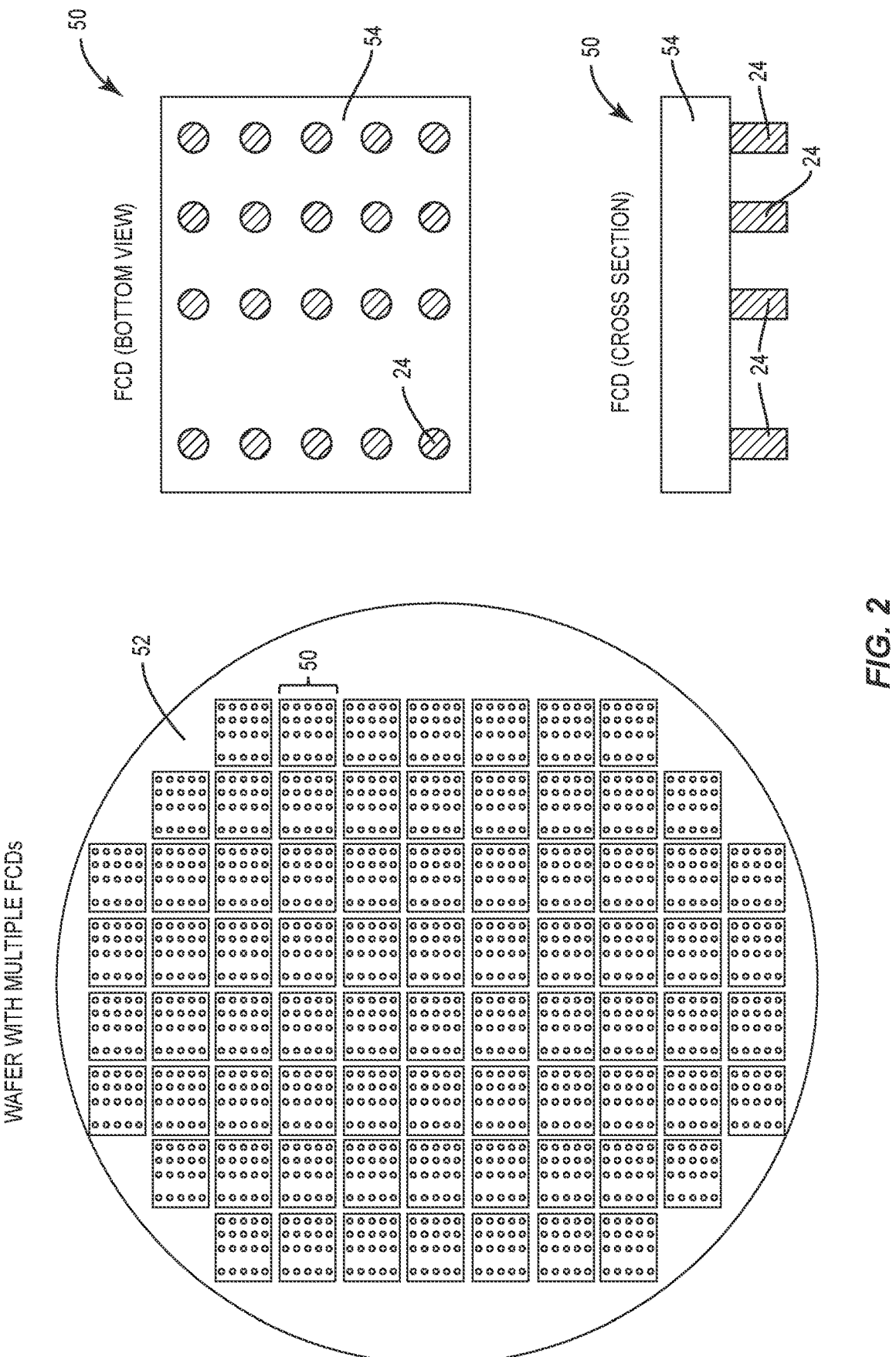

Initially, floor connectivity dies (FCDs) 50, which provide the floor interconnections 24, are formed as illustrated in FIG. 2. In this embodiment, a low-cost silicon wafer 52 is used to plate a pattern of the floor interconnections 24 according to a matrix arrangement that is repeated throughout the silicon wafer 52. Herein, the matrix arrangement is based on an I/O arrangement of the die body 32 of the second device die 18 (more details are discussed below). The silicon wafer 52 is singulated into multiple individual floor connectivity die 50, each of which includes a sacrificial die body 54 and the floor interconnections 24 in a particular arrangement (corresponding to the I/O arrangement of the die body 32 of the second device die 18). Notice that, since the sacrificial die body 54 will not be a part of the final product, the silicon wafer 52 used to produce the floor connectivity dies 50 does not need metallization layers or high-quality silicon portions for device formation, thereby reducing cost. In a non-limited example, one floor connectivity die 50 is around 0.5 mm×0.5 mm, which is the smallest size that current Pick and Place packaging tools are capable of handling. Each floor interconnection 24 may be a copper pillar and targeted to be 50 μm-100 μm tall.

Figure 3:
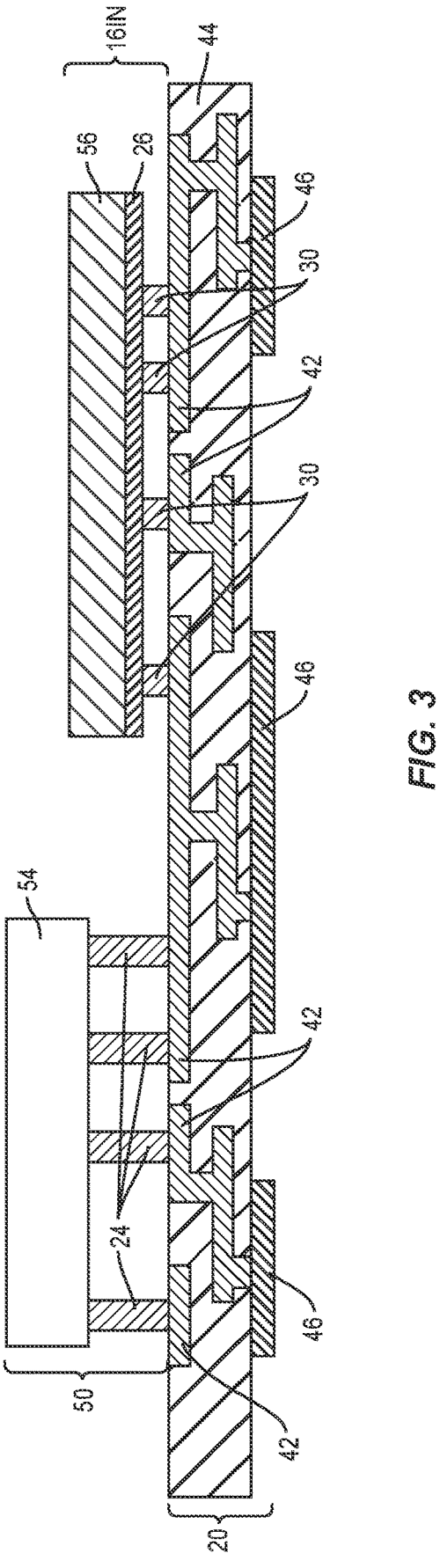

Next, one floor connectivity die 50 and an intact first device die 161N are attached to the top surface of the multilayer laminate 20, as illustrated in FIG. 3. Herein, the intact first device die 161N includes the device layer 26, a silicon substrate 56 over the device layer 26, and the first die interconnections 30 extending from the bottom surface of the device layer 26 towards the top surface of the multilayer laminate 20. Each first die interconnection 30 of the intact first device die 161N and each floor interconnection 24 of the floor connectivity die 50 are coupled to the multilayer laminate 20 via a solder material or a conductive adhesive material (not shown).

In the multilayer laminate 20, some of the connecting layers 42 are configured to electrically connect the intact first device die 161N with the floor connectivity die 50 (i.e., electrically connect one or more first die interconnections 30 with one or more floor interconnections 24), some of the connecting layers 42 are configured to electrically connect the floor connectivity die 50 and corresponding package pads 46 (i.e., electrically connect one or more floor interconnections 24 with the corresponding package pads 46), and/or some of the connecting layers 42 are configured to electrically connect the intact first device die 161N and corresponding package pads 46 (i.e., electrically connect one or more first die interconnections 30 with the corresponding package pads 46). The dielectric pattern 44 is formed around and underneath each connecting layer 42 to isolate the connecting layers 42 from each other. The package pads 46 are separate from each other, located at a bottom portion of the multilayer laminate 20, and protrude from the dielectric pattern 44.

In this illustration, there is only one floor connectivity die 50 placed next to the intact first device die 16IN. For different applications, there might be more than one floor connectivity die 50 attached to the multilayer laminate 20 and either on one side of or surrounding the intact first device die 161N (not shown). Regardless of one or multiple floor connectivity dies 50 attached to the multilayer laminate 20, an entire layout arrangement of all floor interconnections 24 is based on the I/O arrangement of the die body 32 of the second device die 18. Furthermore, the floor interconnections 24 of each floor connectivity die 50 must have a same height greater than a height of a combination of the device layer 26 and the first die interconnections 30 of the intact first device die 16IN. For a non-limited instance, each floor interconnection 24 of the floor connectivity die 50 is 80 μm, the device layer 26 of the intact first device die 16IN is 10 μm, and each first die interconnection 30 of the intact first device die 16IN is 50 μm.

Figure 4:
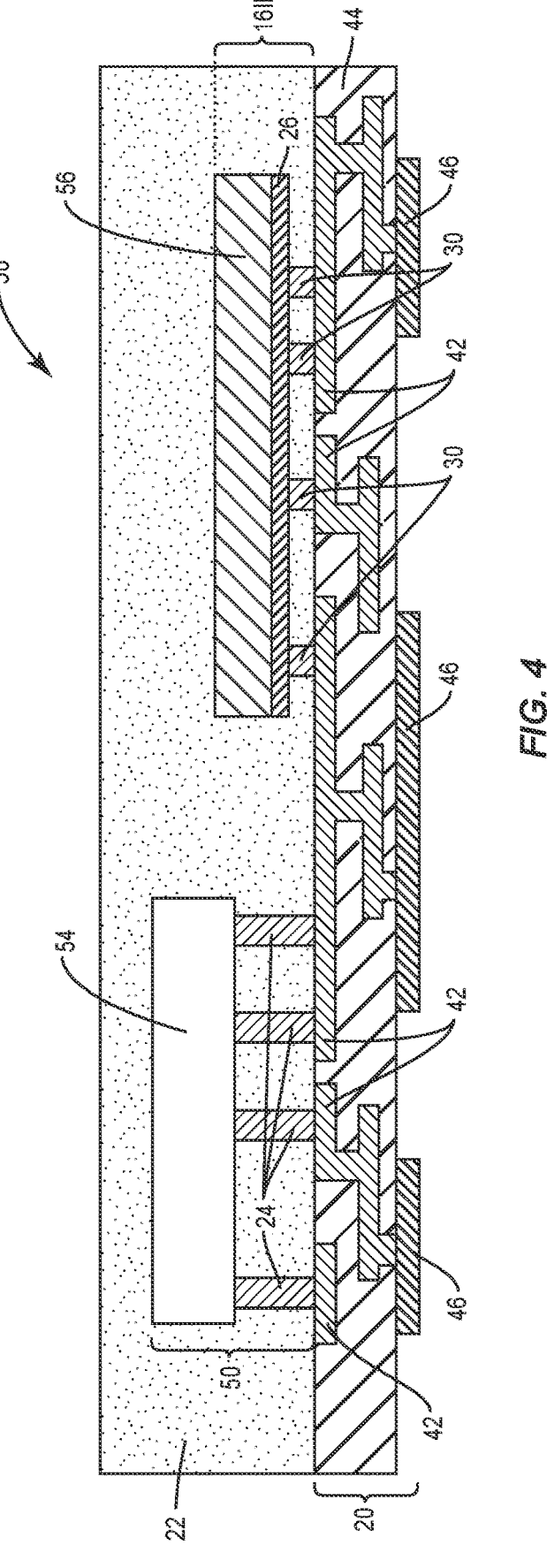

The first mold compound 22 is then applied over the top surface of the multilayer laminate 20 to form a first mold precursor module 58, as illustrated in FIG. 4. Herein, the first mold compound 22 underfills and fully encapsulates the intact first device die 16IN and the floor connectivity die 50. The first mold compound 22 may be applied by various procedures, such as sheet molding, overmolding, compression molding, transfer molding, dam fill encapsulation, or screen print encapsulation. A curing process (not shown) is followed to harden the first mold compound 22. The curing temperature is between 100° C. and 320° C. depending on which material is used as the first mold compound 22.

Figure 5:
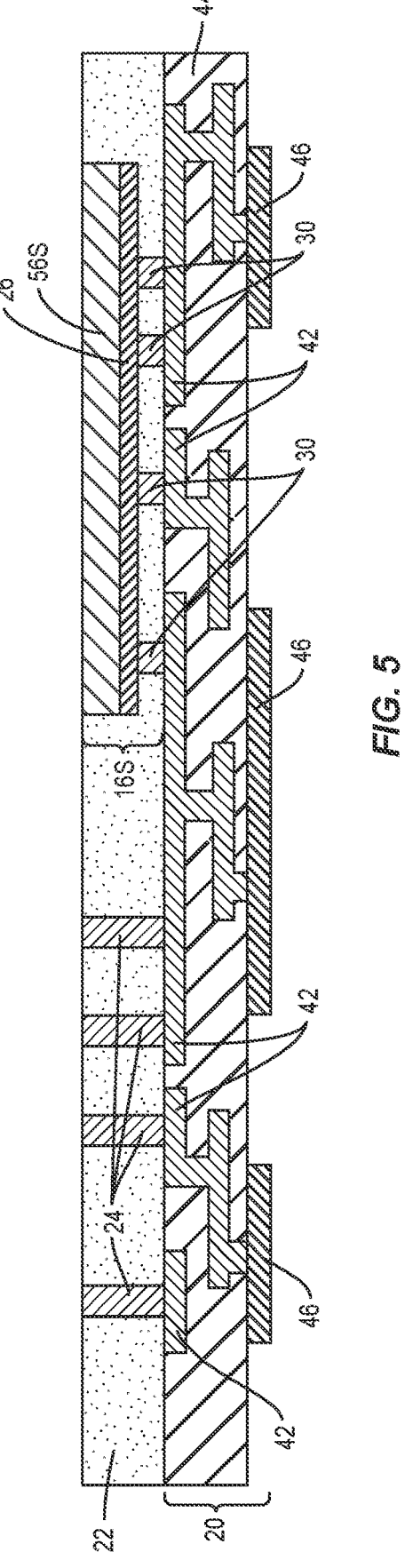

Next, the first mold compound 22 is thinned down until the sacrificial die body 54 of the floor connectivity die 50 is completely consumed, as illustrated in FIG. 5. As such, each floor interconnection 24 is exposed through the first mold compound 22. The thinning procedure may be done with a mechanical grinding process. Since the combination of the device layer 26 and the first die interconnections 30 of the intact first device die 16IN is shorter than the floor interconnections 24, the thinning down process does not affect the device layer 26.

When an entire height of the intact first device die 16IN is greater than the height of the floor interconnections 24, a portion of the silicon substrate 56 (over the device layer 26) of the intact first device die 16IN is also consumed in the thinning down process. The silicon substrate 56 is converted to a short silicon substrate 56S, and the intact first device die 16IN is converted to a short first device die 16S. Herein, the first mold compound 22 surrounds the short first device die 16S and does not cover a top surface of the short silicon substrate 56S. When an entire height of the intact first device die 16IN is less than the height of the floor interconnections 24, the intact first device die 16IN is still fully encapsulated by the first mold compound 22 (not shown).

For some applications, like radio frequency (RF) applications, a silicon substrate may have undesirable properties for RF devices: harmonic distortion and low resistivity values. The harmonic distortion is a critical impediment to achieve high level linearity in the RF devices built over silicon substrates. In addition, the low resistivity encountered in the silicon substrates may degrade quality factors (Q) at high frequencies of MEMS devices or other passive components. Therefore, it is desired to eliminate the silicon substrate in the device die.

Figure 6:
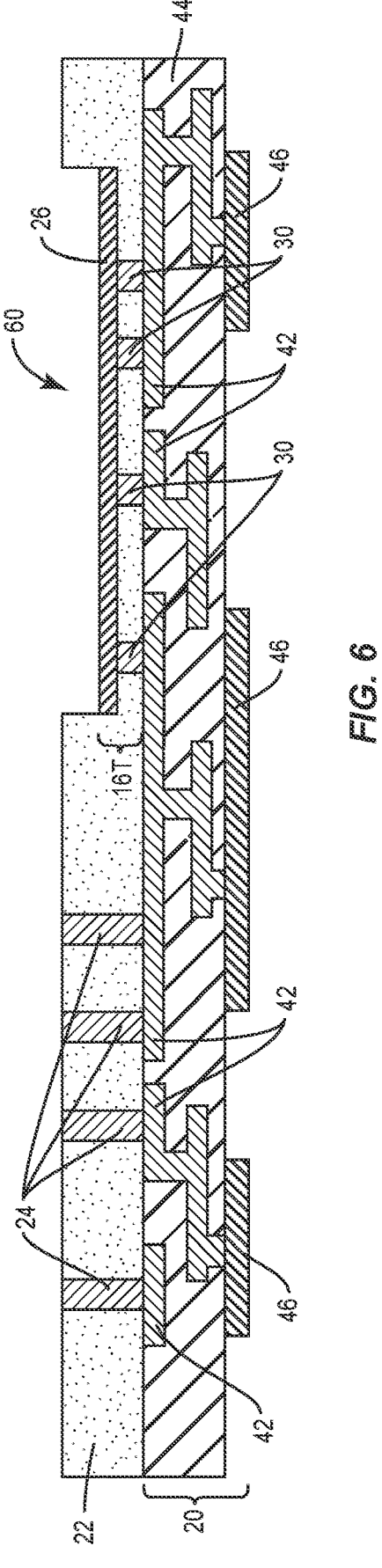

FIG. 6 shows an optional elimination step of the short silicon substrate 56S from the short first device die 16S. The removal of the short silicon substrate 56S from the short first device die 16S provides a thinned first device die 16T and forms a first opening 60 within the first mold compound 22 and over the thinned first device die 16T. Herein, the thinned first device die 16T only includes the device layer 26 and the first die interconnections 30 with substantially no silicon substrate. The substantially no silicon substrate refers to at most 2 μm silicon substrate. In desired cases, the short silicon substrate 56S is removed completely, such that the device layer 26 of the thinned first device die 16T is exposed at the bottom of the first opening 60. Removing the short first silicon substrates 56S may be provided by an etching process with a wet/dry etchant chemistry, which may be Tetramethylammonium hydroxide (TMAH), potassium hydroxide (KOH), sodium hydroxide (NaOH), and acetylcholine (ACH), or the like.

Figure 7:
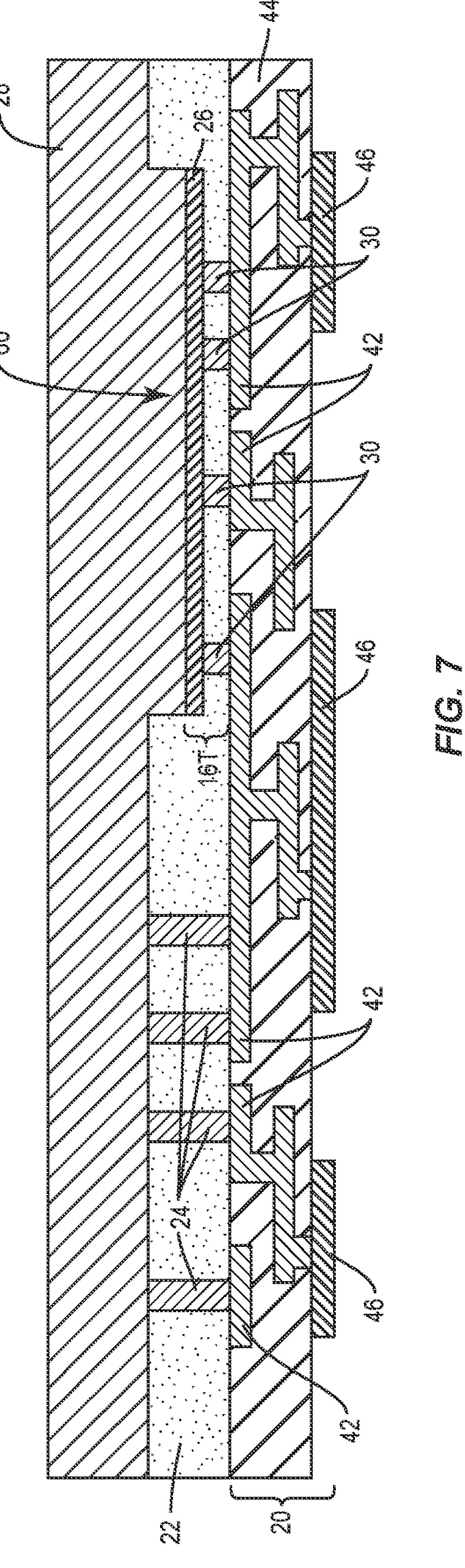

The second mold compound 28 is then applied to fill the first opening 60, as illustrated in FIG. 7. The second mold compound 28 may be applied by various procedures, such as sheet molding, overmolding, compression molding, transfer molding, dam fill encapsulation, and screen print encapsulation. The second mold compound 28 directly resides over a top surface of the thinned first device die 16T. If there is no silicon substrate 56/56S left in the first opening 60, the second mold compound 28 directly resides over the device layer 26. In some cases, the second mold compound 28 may further reside over the first mold compound 22 and covers the top surface of each floor interconnection 24. A curing process (not shown) is followed to harden the second mold compound 28. The curing temperature is between 100° C. and 320° C. depending on which material is used as the second mold compound 28.

Figure 8:
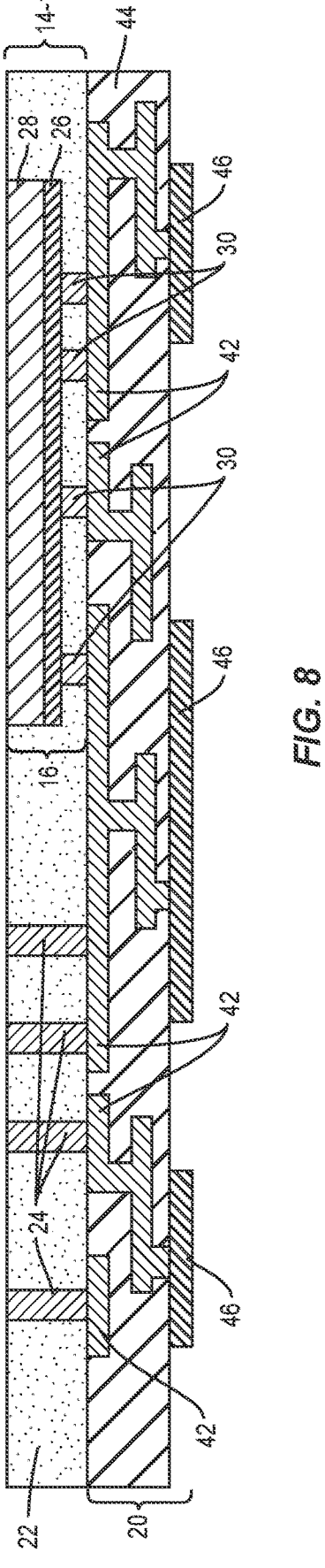

Next, the second mold compound 28 is thinned down and planarized to form the first device die 16, and the first device floor 14-1 is completed, as illustrated in FIG. 8. The second mold compound 28 is thinned down until the top surface of each floor interconnection 24 is exposed. Herein, the top surface of the second mold compound 28 of the first device die 16, the top surface of the first mold compound 22, and the top surface of each floor interconnection 24 are co-planar and compose the top surface of the first device floor 14-1. A mechanical grinding process may be used for this thinning and planarization process.

Notice that if the short first silicon substrate 56S is not replaced by the second mold compound 28, the processing steps shown in FIGS. 6-8 are omitted. In such case, the top surface of the short first silicon substrate 56S, the top surface of the first mold compound 22, and the top surface of each floor interconnection 24 are co-planar and compose a top surface of the first device floor 14-1 (as shown in FIG. 5).

Figure 9A:
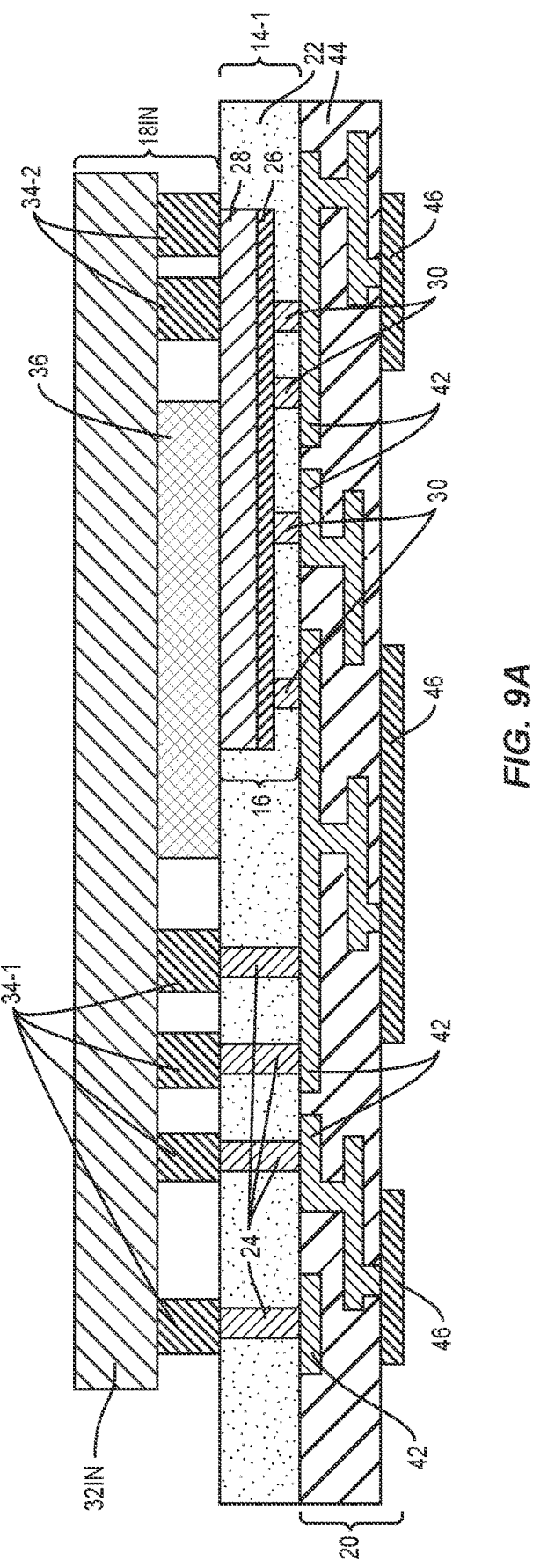
Figure 9B:
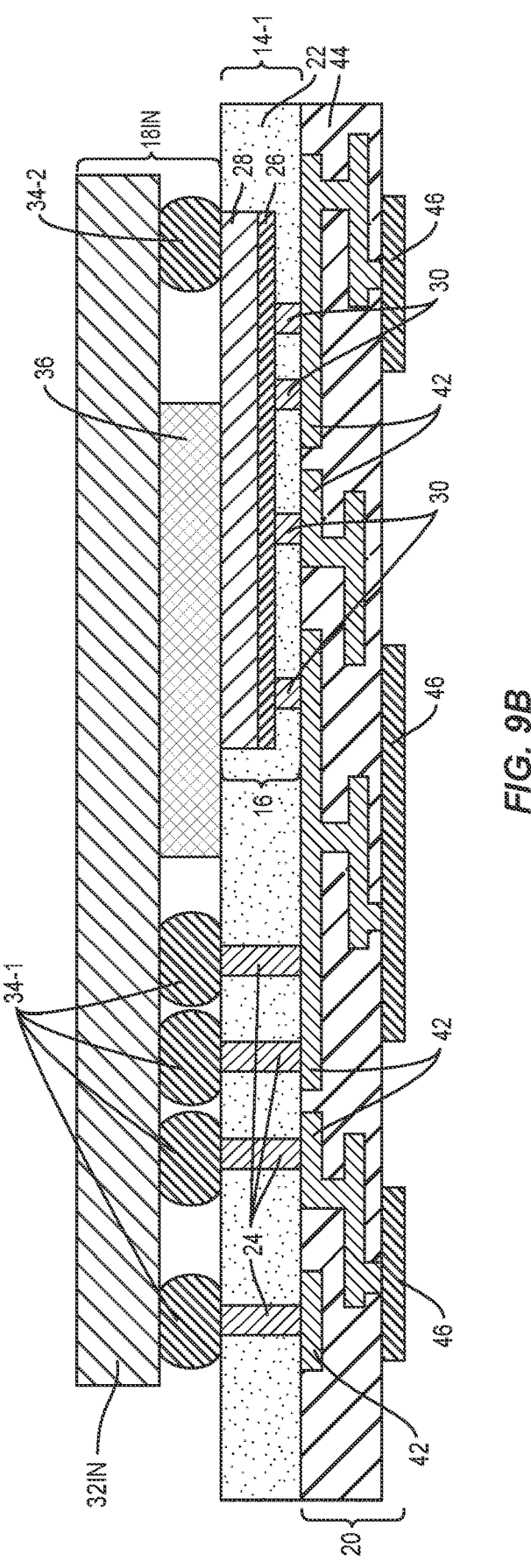

FIGS. 9A and 9B show an intact second device die 18IN mounted on the top surface of the first device floor 14-1. The intact second device die 18IN includes an intact die body 32IN and the multiple second die interconnections 34 extending from a bottom surface of the intact die body 32IN towards the top surface of the top surface of the first device floor 14-1. Each second die interconnection 34 may be a copper pillar as shown in FIG. 9A or may be a solder bump as shown in FIG. 9B. Typically, the intact second device die 18IN has a larger lateral size than the first device die 16. The first device die 16 may partially or completely overlap with the second device die 18.

Notice that, before the intact second device die 18IN is mounted on the first device floor 14-1, an additional step might be needed to prepare each floor interconnection 24 in the first device floor 14-1 to accommodate the second die interconnections 34 of the intact second device die 18IN (not shown). For a non-limited example, the top surface of each floor interconnection 24 may be finished with an organic surface protectant (OSP) and/or a solder material, so as to prepare for accepting the second die interconnections 34 of the intact second device die 18IN. When the top surface of each floor interconnection 24 is finished with the OSP, the OSP will typically be consumed during the step of mounting the intact second device die 18IN on the top surface of the first device floor 14-1. When the top surface of each floor interconnection 24 is finished with the solder material, during the step of mounting the intact second device die 18IN on the top surface of the first device floor 14-1, the solder material will reflow to connect one floor interconnection 24 to a corresponding second die interconnection 34 of the intact second device die 18IN.

Herein, the second die interconnections 34 include multiple electrical second die interconnections 34-1, each of which is electrically coupled to a corresponding I/O port of the intact die body 32IN (not shown), and one or more optional dummy second die interconnections 34-2. A layout arrangement of the electrical second die interconnections 34-1 matches the layout arrangement of the floor interconnections 24 (within the first device floor 14-1 and exposed through the first mold compound 22). As such, each electrical second die interconnection 34-1 can be vertically aligned with a corresponding floor interconnection 24 and electrically connects one I/O port of the intact die body 32IN to the corresponding floor interconnection 24. The electrical second die interconnections 34-1 may be connected to the floor interconnections 24 via the solder material (if the top surface of each floor interconnection 24 is finished with the solder material).

If the dummy second die interconnections 34-2 exist, the backside of the first device die 16 and/or top surface of the first mold compound 22 may also need to be prepared with the solder material or an adhesive material (not shown). The dummy second die interconnections 34-2 are not configured to provide electrical connections (i.e., are not connected to any floor interconnection 24/the first device die 16) but configured to provide mechanical support/stability for the intact die body 32IN. The dummy second die interconnections 34-2 may be coupled to the backside of the first device die 16 and/or top surface of the first mold compound 22 via the solder material or the adhesive material.

In addition, the intact second device die 18IN may further include the adhesive layer 36, which is configured to provide adhesion between the bottom surface of the intact die body 321N and the top surface of the first device floor 14-1 and to provide further stability to the intact die body 32IN. The adhesive layer 36 may be coupled to the backside of the first device die 16 and/or top surface of the first mold compound 22. The adhesive layer 36 may not be necessary if the device die mount is stable without it. Conversely, if the first device die 16 is a MEMS device, it may be highly desirable to have a soft material like the adhesive layer 36 over the MEMS die 16 to minimize any stress during the following molding process.

Figure 10:
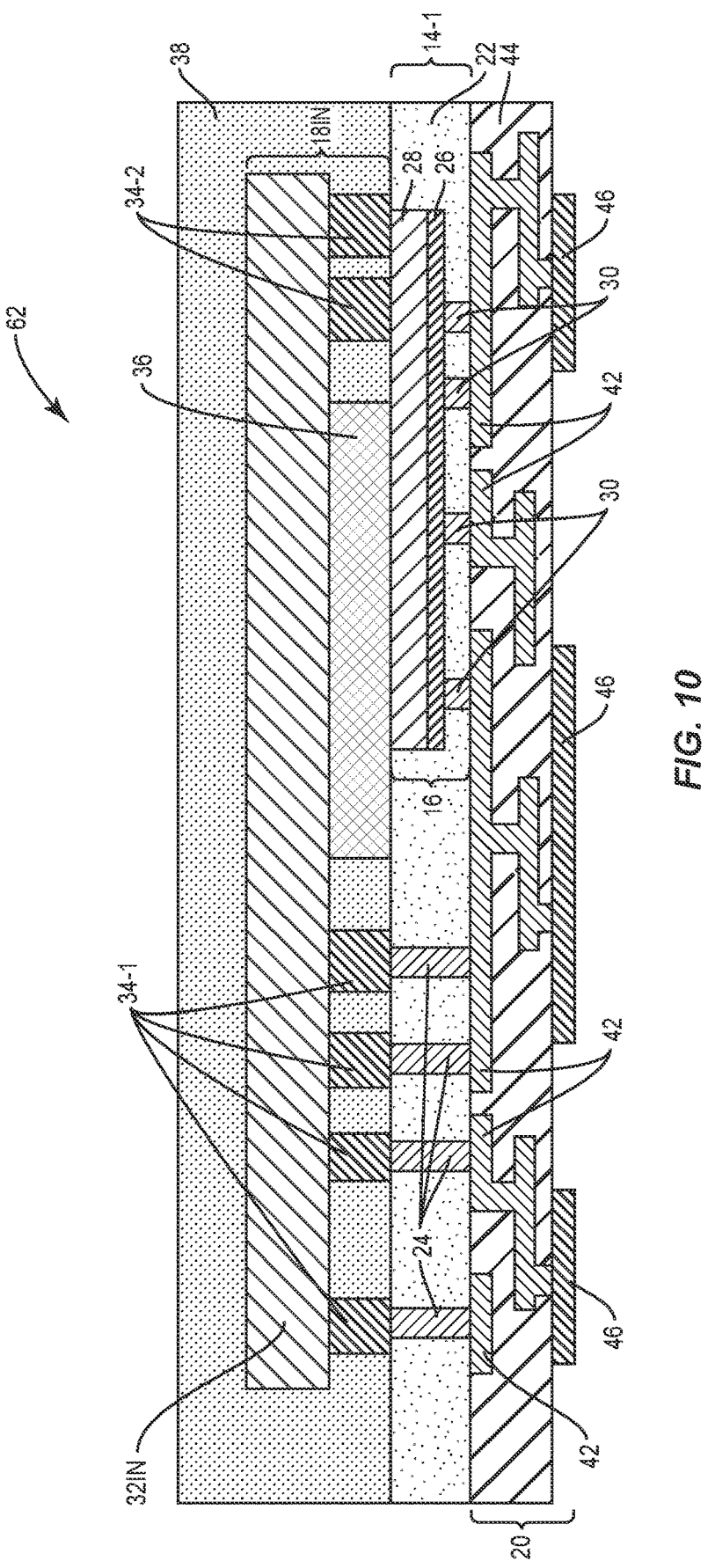

Next, the third mold compound 38 is applied over the top surface of the first device floor 14-1 to form a second mold precursor module 62, as illustrated in FIG. 10. Herein, the third mold compound 38 underfills and fully encapsulate the intact second device die 18IN, and may be formed of a same material as the first mold compound 22. The third mold compound 38 may be applied by various procedures, such as sheet molding, overmolding, compression molding, transfer molding, dam fill encapsulation, or screen print encapsulation. A curing process (not shown) is followed to harden the third mold compound 38. The curing temperature is between 100° C. and 320° C. depending on which material is used as the third mold compound 38.

Figure 11:
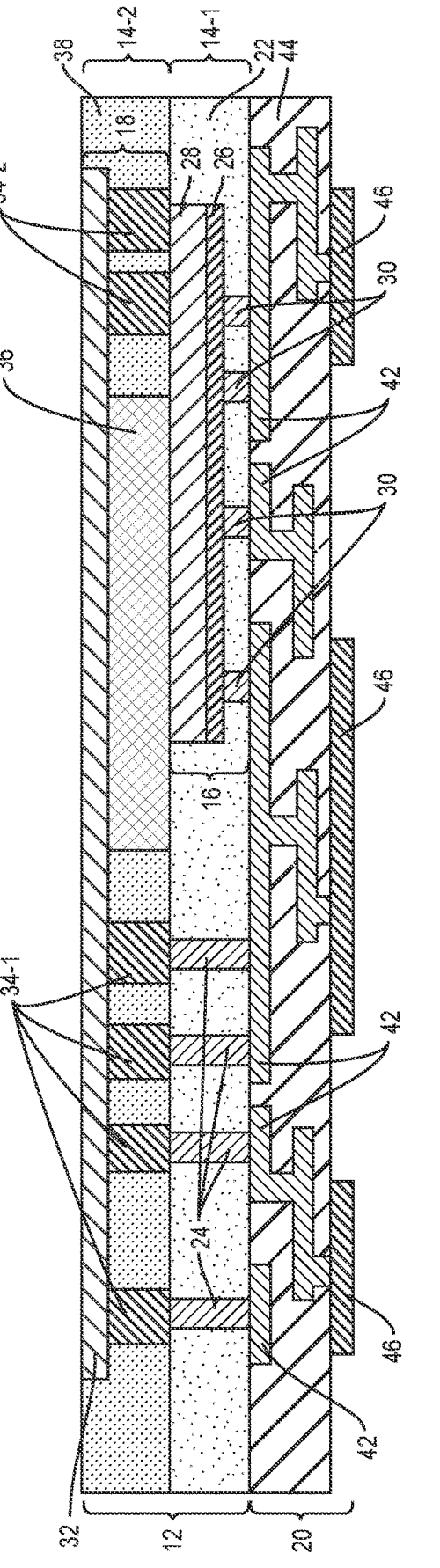

To achieve a desire thickness of the final product, the third mold compound 38 may be thinned down and a backside portion of the intact die body 321N of the intact second device die 18IN may be consumed, as illustrated in FIG. 11. The intact die body 321N is converted to the die body 32, the intact second device die 18IN is converted to the second device die 18, and the second device floor 14-2 is completed. The top surface of the die body 32 of the second device die 18 and the top surface of the third mold compound 38 are co-planar and compose the top surface of the second device floor 14-2. This thinning procedure may be done with a mechanical grinding process.

Figure 12:
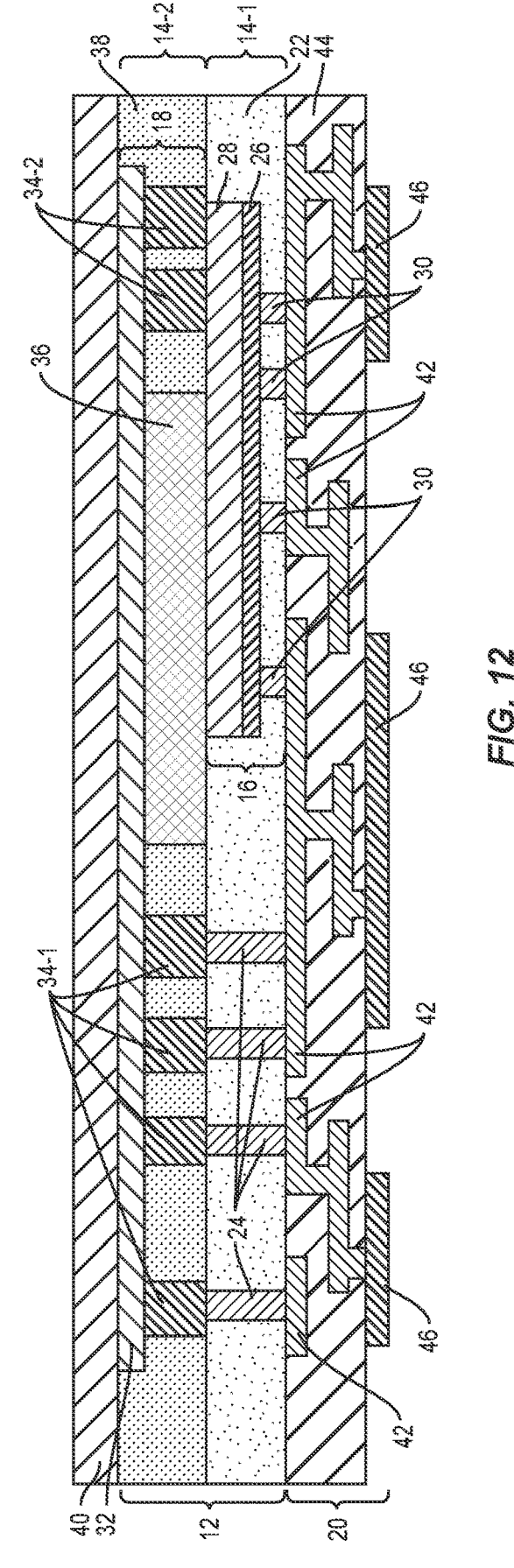

Lastly, the lamination sheet 40 may be applied over the top surface of the second device floor 14-2 to complete the 3D package 10, as illustrated in FIG. 12. The lamination sheet 40 provides isolation of the second device die 18 and a suitable surface for labeling for the 3D package 10, since the exposed die body 32 of the second device die 18 cannot be easily laser marked.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing a first mold precursor module, which includes a multilayer laminate, an intact first device die, a floor connectivity die, and a first mold compound, wherein:

the intact first device die includes a device layer, a silicon substrate over the device layer, and a plurality of first die interconnections extending from a bottom surface of the device layer towards a top surface of the multilayer laminate, while the floor connectivity die includes a sacrificial die body and a plurality of floor interconnections extending from a bottom surface of the sacrificial die body towards the top surface of the multilayer laminate;

the first mold compound resides over the top surface of the multilayer laminate so as to encapsulate the intact first device die and the floor connectivity die; and each of the plurality of floor interconnections has a same height greater than a height of a combination of the device layer and the plurality of first die interconnections of the intact first device die;

thinning down the first mold compound until the sacrificial die body of the floor connectivity die is completely consumed, such that each of the plurality of floor interconnections is exposed through the first mold compound; and mounting an intact second device die over the plurality of floor interconnections, wherein:

the intact second device die includes an intact die body and a plurality of electrical second die interconnections extending from a bottom surface of the intact die body; and a layout arrangement of the plurality of electrical second die interconnections matches a layout arrangement of the plurality of floor interconnections, and each of the plurality of electrical second die interconnections is vertically aligned with and electrically connected to a corresponding floor interconnection.

2. The method of claim 1 wherein:

the intact second device die further includes at least one dummy second die interconnection extending from the bottom surface of the intact die body; and the at least one dummy second die interconnection is configured to provide mechanical support to the intact die body of the intact second device die and is not connected to any of the plurality of floor interconnections exposed through the first mold compound.

3. The method of claim 2 wherein the at least one dummy second die interconnection is a copper pillar or a solder bump.

4. The method of claim 1 wherein:

the intact second device die further includes an adhesive layer underneath the bottom surface of the intact die body; and the adhesive layer is configured to provide stability to the intact die body of the intact second device die and is not connected to any of the plurality of floor interconnections exposed through the first mold compound.

5. The method of claim 4 wherein the intact first device die is a micro-electro-mechanical system (MEMS) die, and the intact second device die is a controller die that controls the intact first device die.

6. The method of claim 1 wherein:

an entire height of the intact first device die is greater than the height of each of the plurality of floor interconnections, such that a portion of the silicon substrate is consumed in the thinning down process of the first mold compound;

the silicon substrate is converted to a short silicon substrate, and the intact first device die is converted to a short first device die; and the first mold compound surrounds the short first device die and does not cover a top surface of the short silicon substrate.

7. The method of claim 6 further comprising:

after thinning down the first mold compound, eliminating the short silicon substrate from the short first device die to provide a thinned first device die and form a first opening within the first mold compound and over the thinned first device die;

applying a second mold compound to fill the first opening; and before mounting the intact second device die, planarizing the second mold compound to form a first device die and complete a first device floor, wherein:

the first device die includes the thinned first device die and the second mold compound;

a top surface of the second mold compound of the first device die, a top surface of the first mold compound, and a top surface of each of the plurality of floor interconnections are co-planar and compose a top surface of the first device floor; and the intact second device die is mounted on the top surface of the first device floor.

8. The method of claim 7 wherein the first mold compound and the second mold compound are formed of different materials.

9. The method of claim 7 further comprising, after mounting the intact second device die, applying a third mold compound over the top surface of the first device floor to encapsulate the intact second device die.

10. The method of claim 9 further comprising thinning down the third mold compound to complete a second device floor over the first device floor, wherein:

the third mold compound is thinned down until a portion of the intact die body of the intact second device die is consumed;

the intact die body is converted to a die body, and the intact second device die is converted to a second device die;

the third mold compound surrounds the second device die and does not cover a top surface of the die body; and a top surface of the third mold compound and a top surface of the top surface of the die body are co-planar and compose a top surface of the second device floor.

11. The method of claim 10 further comprising applying a lamination sheet over the top surface of the second device floor.

12. The method of claim 10 wherein:

the second device die has a larger lateral size than the first device die; and the first device die at least partially overlaps with the second device die.

13. The method of claim 9 wherein:

the first mold compound and the second mold compound are formed of different materials; and the first mold compound and the third mold compound are formed of a same material.

14. The method of claim 1 wherein each of the plurality of electrical second die interconnections is a copper pillar or a solder bump.

15. The method of claim 1 wherein each of the plurality of first die interconnections is a copper pillar or a solder bump.

16. The method of claim 1 wherein each of the plurality of floor interconnections is a copper pillar.

17. The method of claim 1 wherein each of the plurality of floor interconnections has a height between 50 μm and 100 μm.

18. The method of claim 1 wherein the multilayer laminate includes multiple connecting layers and a dielectric pattern which separates the connecting layers from each other, wherein certain connecting layers are configured to electrically connect the intact first device die and the intact second device die via corresponding ones of the plurality of floor interconnections.

19. The method of claim 1 wherein an entire height of the intact first device die is less than the height of each of the plurality of floor interconnections, such that no portion of the silicon substrate is consumed in the thinning down process of the first mold compound, and the intact first device die remains fully encapsulated by the first mold compound.

20. The method of claim 6 wherein:

a top surface of the short silicon substrate of the short first device die, a top surface of the first mold compound, and a top surface of each of the plurality of floor interconnections are co-planar; and the intact second device die is mounted over the short first device die.

* * * * *